(12) United States Patent
Shishido et al.

(10) Patent No.: US 8,481,936 B2
(45) Date of Patent: *Jul. 9, 2013

(54) SCANNING ELECTRON MICROSCOPE SYSTEM AND METHOD FOR MEASURING DIMENSIONS OF PATTERNS FORMED ON SEMICONDUCTOR DEVICE BY USING THE SYSTEM

(75) Inventors: Chie Shishido, Kawasaki (JP); Maki Tanaka, Mito (JP); Atsushi Miyamoto, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/348,813

(22) Filed: Jan. 12, 2012

(65) Prior Publication Data

US 2012/0112067 A1 May 10, 2012

Related U.S. Application Data

(63) Continuation of application No. 12/370,870, filed on Feb. 13, 2009, now Pat. No. 8,110,800.

(30) Foreign Application Priority Data

Feb. 22, 2008 (JP) ................................. 2008-040816

(51) Int. Cl.
*H01J 37/26* (2006.01)
(52) U.S. Cl.
USPC ............ 250/311; 250/306; 250/307; 250/310
(58) Field of Classification Search
USPC ...... 250/306, 307, 310, 311; 430/296; 702/33, 702/35, 40, 172
See application file for complete search history.

(56) References Cited

U.S. PATENT DOCUMENTS

| 8,110,800 B2 * | 2/2012 | Shishido et al. ............... 250/311 |
| 2006/0169896 A1 | 8/2006 | Ataka et al. |
| 2007/0187595 A1 * | 8/2007 | Tanaka et al. ................. 250/307 |
| 2009/0214103 A1 | 8/2009 | Tanaka et al. |

FOREIGN PATENT DOCUMENTS

| JP | 2001-338304 | 12/2001 |
| JP | 2007-121147 | 5/2007 |

OTHER PUBLICATIONS

Hidekazu Suzuki and Ryoichi Matsuoka, "Evaluation System for Wafer Transferred Pattern Shape Based on CAD Data/Grade Scope," LSI Testing Symposium 2002, Proceedings, pp. 31-33 (2002).
J. S. Villarrubia, A. E. Vladar, J. R. Lowney, and M. T. "Scanning electron microscope analog of scatterometry," Postek, Proc. SPIE 4689, pp. 304-312.

* cited by examiner

*Primary Examiner* — Nicole Ippolito
(74) *Attorney, Agent, or Firm* — Antonelli, Terry, Stout & Kraus, LLP.

(57) ABSTRACT

The present invention is for providing a scanning electron microscope system adapted to output contour information fitting in with the real pattern edge end of a sample, and is arranged to generate a local projection waveform by projecting the scanning electron microscope image in the tangential direction with respect to the pattern edge at each point of the pattern edge of the scanning electron microscope image, estimate the cross-sectional shape of the pattern transferred on the sample by applying the local projection waveform generated at each point to a library, which has previously been created, correlating the cross-sectional shape with the electron beam signal waveform, obtain position coordinate of the edge end fitting in with the cross-sectional shape, and output the contour of the pattern as a range of position coordinates.

16 Claims, 20 Drawing Sheets

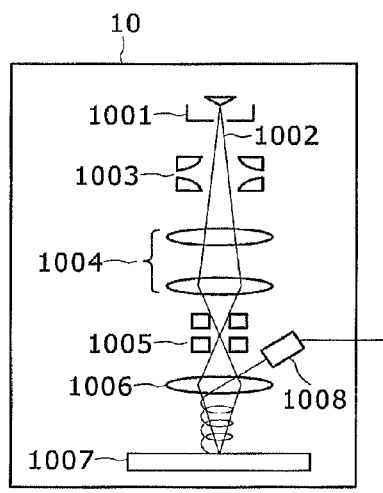
FIG.1A
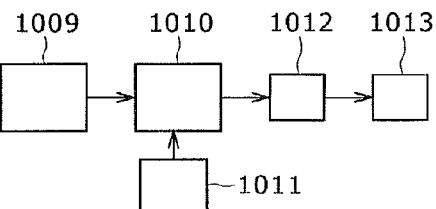
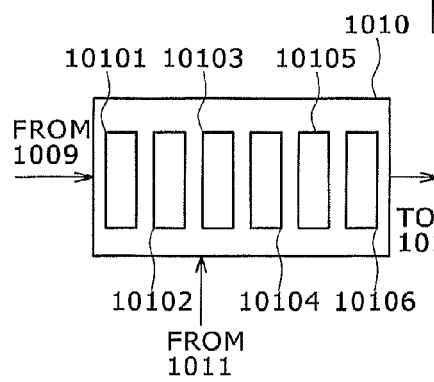
FIG.1B
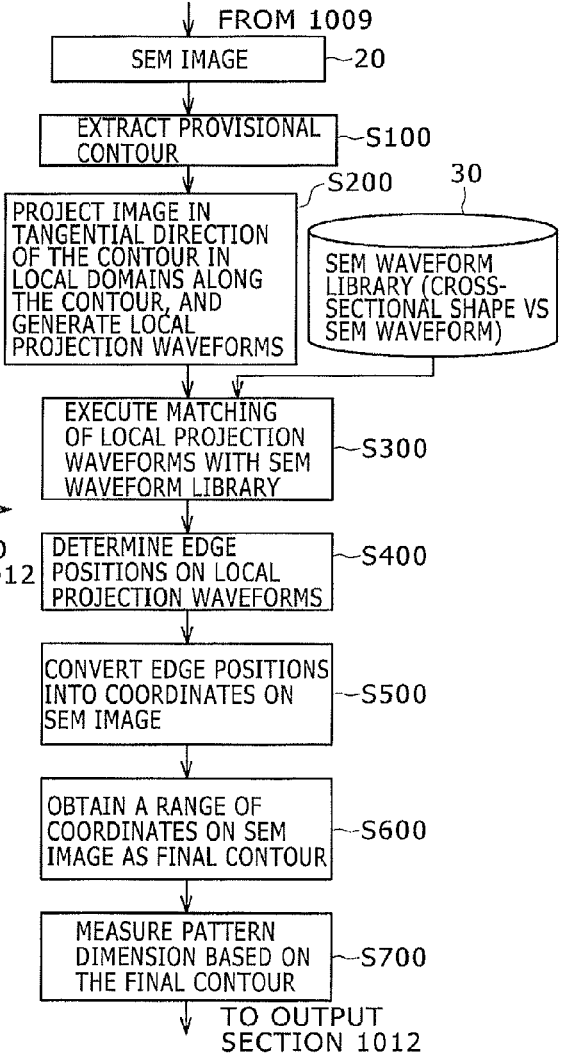
FIG.1C

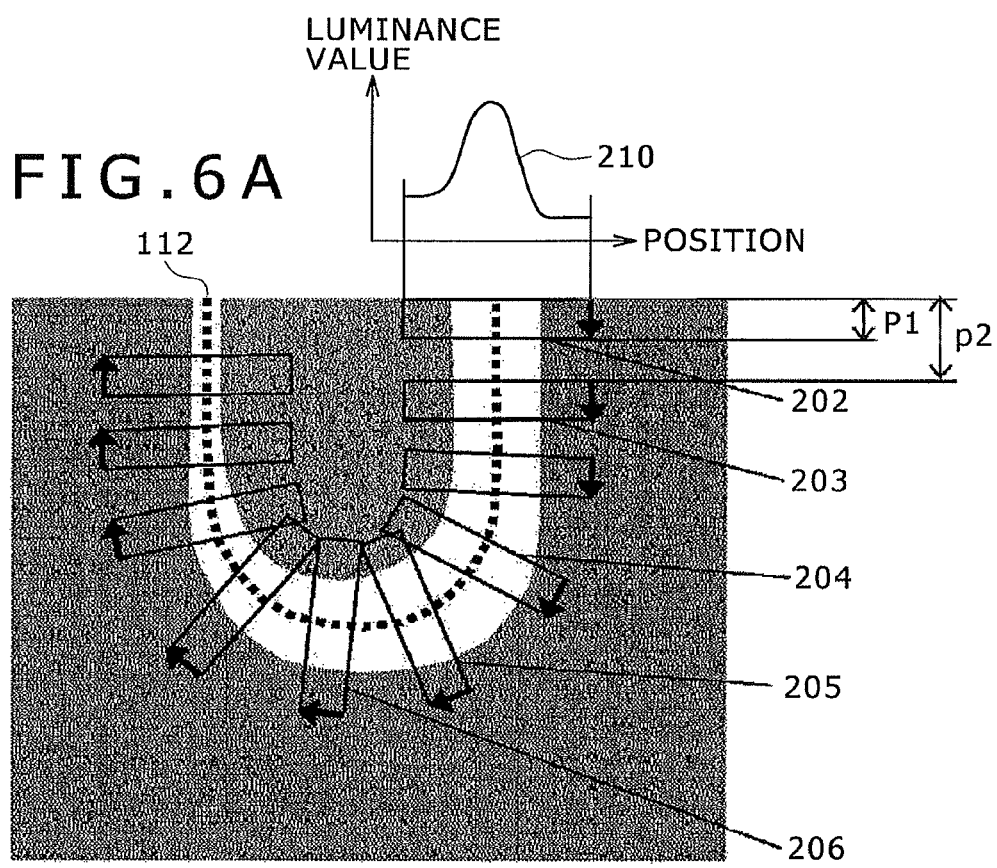

EDGE END POSITION

EDGE END POSITION

FIG.15A
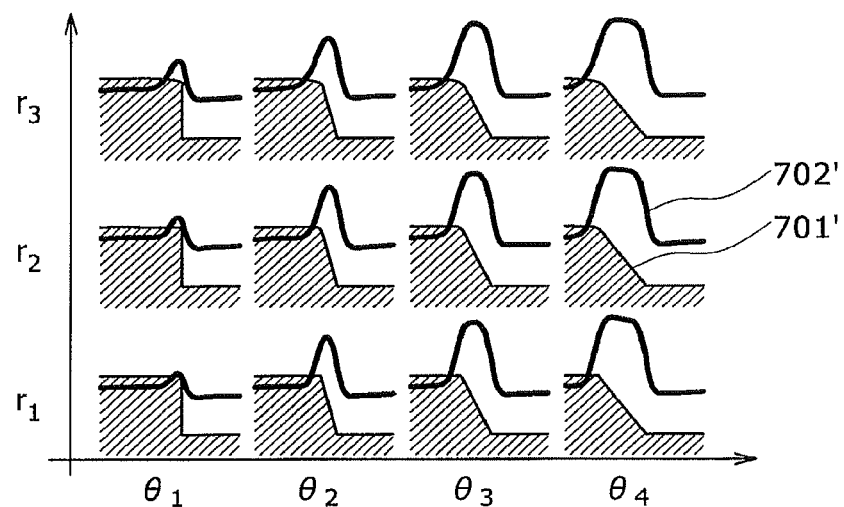
FIG.15B
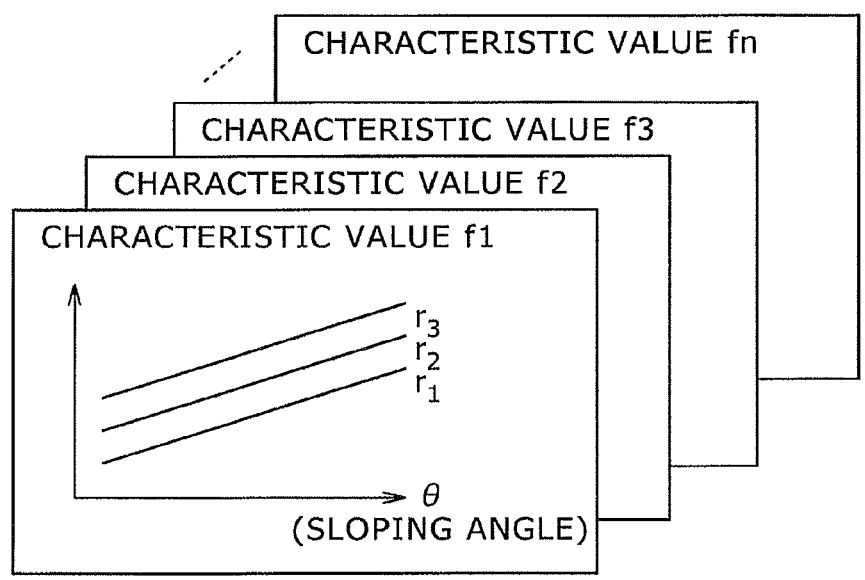

SCANNING ELECTRON MICROSCOPE SYSTEM AND METHOD FOR MEASURING DIMENSIONS OF PATTERNS FORMED ON SEMICONDUCTOR DEVICE BY USING THE SYSTEM

CLAIM OF PRIORITY

This application is a continuation application of application Ser. No. 12/370,870, filed Feb. 13, 2009 now U.S. Pat. No. 8,110,800 which claims priority from Japanese application serial no. JP2008-040816, filed on Feb. 22, 2008, the content of which is hereby incorporated by reference into this application.

BACKGROUND OF THE INVENTION

The present invention relates to a pattern image measurement system adapted to measure a pattern image obtained by imaging a photo mask used in a lithography process of semiconductor manufacturing or a wafer having been processed by the lithography process with a scanning electron microscope.

RELATED ART

Due to the miniaturization of semiconductor circuit patterns, the resolution of exposure devices reaches a limit, and in order for forming the circuit patterns on a silicon wafer as designed, an Optical Proximity Correction (OPC) process for previously putting correction patterns into the design data of the photo mask thereby controlling the finished shapes thereof is becoming in heavy use.

The OPC patterns are designed based on the exposure simulation for estimating how the photo mask pattern on which the OPC process has been executed is transferred on a silicon wafer. It is required for the verification thereof, namely the confirmation that the circuit patterns have been formed on the wafer as designed to observe the patterns (resist patterns) transferred on the wafer. "Evaluation System for Wafer Transferred Pattern Shape Based On CAD Data/Grade Scope," by Hidekazu Suzuki and Ryoichi Matsuoka, LSI Testing Symposium 2002, Proceedings, pp. 31-33 (2002) discloses a system for displaying an image (FIG. 2C) obtained by overlapping the design data (FIG. 2B) with the patterns (FIG. 2A) on the wafer imaged by a scanning electron microscope.

Further, JP-A-2007-121147 and JP-A-2001-338304 disclose a method for digitalizing an amount of pattern deformation including the steps of detecting an edge in a scanning electron microscope image to obtain a pattern contour, overlapping the pattern contour with the design data, and digitalizing the amount of pattern deformation based on a positional relationship therebetween at each pattern region.

In order for performing the verification of the OPC process more accurately, it is essential that the pattern contour obtained from the scanning electron microscope image fits in with the real pattern edge end of the sample. However, JP-A-2007-121147 and JP-A-2001-338304 do not at all consider capturing the pattern edge end correctly.

FIG. 3 shows an edge detection method disclosed in JP-A-2007-121147. Although the edge section appears in the secondary electron microscope image (SEM image) as a bright band, namely the white band, according to the method shown in FIG. 3, a rough center line of the white band (see the reference numeral 604 in the drawing) is taken as the edge position.

FIGS. 4A and 4B show an edge detection method disclosed in JP-A-2001-338304. A profile acquired in a profile acquisition interval shown in FIG. 4A is provided with a threshold value T as shown in FIG. 4B, and the intersection (indicated as Q in the drawing) between the profile and the threshold value T is taken as the edge position.

Incidentally, as shown in "Scanning electron microscope analog of scatterometry," by J. S. Villarrubia, A. E. Vladar, J. R. Lowney, and M. T. Postek, Proc. SPIE 4689, pp. 304-312 (2002), an SEM signal waveform varies depending on a cross-sectional shape of an object pattern. FIG. 5A shows a part of the SEM image shown in FIG. 2A. The difference in the cross-sectional shape of the sample between the regions appears as the variation in the white band width between the regions. The region A with a small width of the white band (the white part in the drawing) is supposed to have a steep edge, while the region B with a large width of the white band is supposed to have a slope (a relatively large sloped edge). FIG. 5B is a schematic diagram of cross-sectional shapes and secondary electron signal waveforms of the patterns corresponding respectively to the region A and the region B. In general, the position needs to be captured as the end of the pattern edge is a bottom end (the part indicated in the drawing as EDGE END TO BE DETECTED) of the pattern, and corresponds to the position on the secondary electron waveform, provided with a black circle.

However, according to the pattern edge detection method (FIG. 3) described in JP-A-2007-121147, the edge positions to be detected are on the center line of the white band, and therefore, correspond to the positions provided with black triangles in FIG. 5C. Further, according to the pattern edge detection method (FIGS. 4A and 4B) described in JP-A-2001-338304, the edge positions to be detected, which depend on the threshold value T, become the positions provided with black squares in FIG. 5D assuming that the midpoint between max and min is taken as the threshold value, for example.

It is obvious that the bottom end of the pattern indicated with the black circle in FIG. 5B is not detected in FIGS. 5C and 5D. What is further problematical is the fact that the distance between the edge position detected in FIGS. 5C and 5D and the bottom end varies depending on the cross-sectional shape of the pattern (between the region A and region B in the drawing).

As is obvious from the fact that the white band widths are different between the regions in FIG. 5A, the cross-sectional shape of the pattern is not uniform. In the related art, a difference is caused between the edge position detected and the real pattern edge end, and moreover, there is caused a situation that an amount of the difference is different by location.

The point of the related art is that no attention at all is paid to the fact that the signal waveform to be detected varies depending on the cross-sectional shapes of the object pattern. Either of the method taking the center line of the white band as the edge position described in JP-A-2007-121147 and the method taking the intersection between the threshold value and the profile as the edge position described in JP-A-2001-338304 only has an ambiguous physical meaning of the edge position detected.

The purpose of verifying the OPC process is to confirm that the circuit patterns as designed are formed on the wafer, and to change the size of the correction pattern if it has proved that the patterns are not formed as designed. In the situation in which the pattern edge end is not detected correctly as described above, the adjustment amount of the correction pattern size might be misled, and it is obvious that the highly accurate OPC verification is not achieved.

SUMMARY OF THE INVENTION

The present invention is for providing a scanning electron microscope system capable of extracting contour information fitting in with the real pattern edge end of the sample, thereby performing highly reliable dimension measurement.

Specifically, in the present invention, a scanning electron microscope system is configured to include means for acquiring an image of a desired area of a sample provided with a pattern formed on a surface using a scanning electron microscope, means for storing a library correlating a cross-sectional shape of the pattern of the sample and electron beam signal waveform information corresponding to the cross-sectional shape of the pattern, means for extracting dimension information of the pattern by processing information obtained from the image of the pattern of the sample obtained by the capturing means, looking up the library information stored in the storage means, and means for displaying information on a screen, the information being related to the dimension of the pattern extracted by the extracting means.

Further, in the present invention, it is arranged that a method for measuring dimensions of patterns formed on a semiconductor device by using the scanning electron microscope system, includes the steps of (a) acquiring an image of a desired area of a sample provided with a pattern formed on a surface using a scanning electron microscope, (b) storing a library correlating a cross-sectional shape of the pattern of the sample and electron beam signal waveform information corresponding to the cross-sectional shape of the pattern, (c) extracting dimension information of the pattern by processing information obtained from the image of the pattern of the sample obtained, looking up the library information stored in step (b), and (d) displaying information on a screen, the information being related to the dimension of the pattern extracted.

According to the present invention, since the cross-sectional shape of the pattern is estimated by applying the projection waveform at each point of the pattern edge of the scanning electron microscope image to a library correlating the cross-sectional shape of the sample with the electron beam signal waveform, the edge end (e.g., the bottom end) with a desired definition in the estimated cross-sectional shape is determined as the edge position, and the range of the edge positions is determined as the contour of the pattern, the contour fitting in with the real pattern edge end of the sample is output.

In the case in which the cross-sectional shape differs between the regions, the present invention displays the greatest advantage. As described in "Related Art" section, in the related art, the amount of difference between the real pattern edge end and the edge end to be detected differs between the regions. In particular, in the case of performing the OPC verification with high accuracy, the problem becomes serious. According to the present invention, since the cross-sectional shape is estimated for each region, and the edge position is determined in accordance with the cross-sectional shape thus estimated, the problem that the amount of difference from the real pattern edge end differs between the regions can be solved.

These and other objects, features and advantages of the invention will be apparent from the following more particular description of preferred embodiments of the invention, as illustrated in the accompanying drawings.

BRIEF DESCRIPTION OF THE DRAWINGS

FIG. 1A is a diagram showing a schematic configuration of an SEM device, FIG. 1B is a block diagram showing a configuration of an operation section for processing the SEM image to obtain the dimension of a pattern, and FIG. 1C is a flowchart showing a processing procedure in the operation section.

FIG. 6A is a diagram enlargedly showing the vicinity of the region B shown in FIG. 5A, and FIG. 6B is a diagram showing a local projection waveform obtained by projecting the image in each local rectangular area.

FIG. 15A is a diagram showing an example of the SEM waveform library obtained by an electron beam simulation in the third embodiment, and FIG. 15B is a diagram showing an example of an SEM waveform characteristic value library obtained from the SEM waveform library.

DESCRIPTION OF THE PREFERRED EMBODIMENTS

Figure 2A:
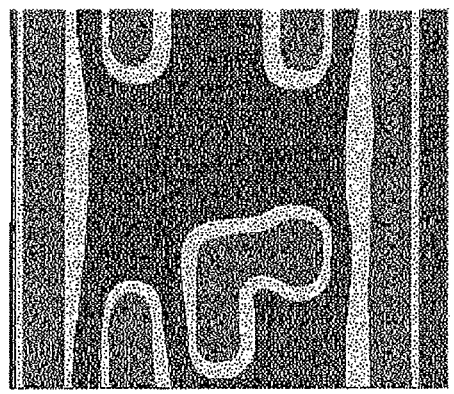
FIG. 2A is an SEM image of patterns on a wafer imaged by the scanning electron microscope.
Figure 2B:
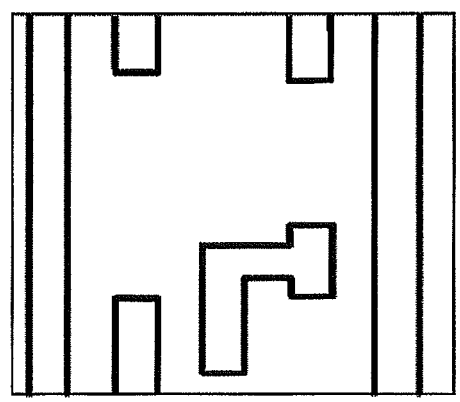
FIG. 2B shows design data.
Figure 2C:
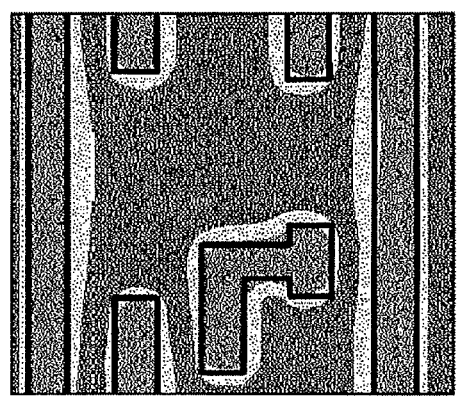
FIG. 2C is a diagram for explaining the related art, and showing the condition of displaying the SEM image and the design data in an overlapping manner.

Although the present invention can be applied to various charged particle beam devices (e.g., SEM and FIB), a Scanning Electron Microscope (SEM) will be explained as a representative target.

First Embodiment

A flow of shape measurement in a semiconductor wafer shape measurement device according to the present invention is shown in FIGS. 1A through 1C.

Firstly, an acquisition method of an SEM image using an SEM device 10 will be explained with reference to FIG. 1A. An electron beam 1002 emitted from an electron gun 1001 of the SEM 10 is accelerated by an acceleration electrode 1003, then converged by a convergent lens 1004, scanned by a deflector 1005 in X and Y directions (in a plane perpendicular to the sheet of the drawing in FIG. 1A), focused by an objective lens 1006 on a surface of a sample 1007 provided with a measurement object patterns, so as to illuminate the surface of the sample 1007 in a scanning manner. Although omitted from illustration in FIG. 1A, the sample 1007 is mounted on a table so as to be movable in a plane, and is controlled so that a desired area of the surface of the sample 1007 is positioned in the irradiation range of the electron beam 1002.

A part of the secondary electrons generated from the surface of the sample 1007 irradiated with the electron beam 1002 is detected and converted into an electric signal by a detector 1008. The electric signal is then transmitted to an overall control/image processing section 1009. The overall control/image processing section 1009 creates an SEM image based thereon. An operation section 1010 processes the SEM image to calculate a dimension of a pattern using information of a SEM waveform library stored in a storage section 1011. The result is displayed on a screen of an output section 1012. Further, the pattern dimension calculation result is stored in a server 1013 via a communication line. The overall control/image processing section 1009 also performs overall control of the SEM 10 including a table, not shown, for mounting the sample 1007.

As shown in FIG. 1B, the operation section 1010 is provided with a provisional contour extraction section 10101, a local projection waveform forming section 10102, a library matching section 10103, an edge position determination section 10104, a coordinate conversion/contour extraction section 10105, and a dimension measurement section 10106.

A processing procedure in the operation section 1010 will be explained along the flowchart shown in FIG. 1C, while explaining each of the steps S100 through S600.

(S100): The provisional contour extraction section 10101 extracts a provisional contour from the SEM image obtained by the SEM 10. As an extraction method for the provisional contour, the related art shown in FIG. 3 can be applied. Hereinafter, FIG. 3 will be explained. A smoothing process (601) for removing noises is executed on an input image 105, an edge is detected by an edge-emphasizing filter process such as a Sobel filter (602), and a binarizing process is executed thereon to obtain a binarized image with "1" in the edge section and "0" in the other sections (603). Subsequently, a line-thinning process such as contraction of the pattern width into one pixel is executed to detect a center line (604). The line drawing (112) becomes the provisional contour.

Figure 3:
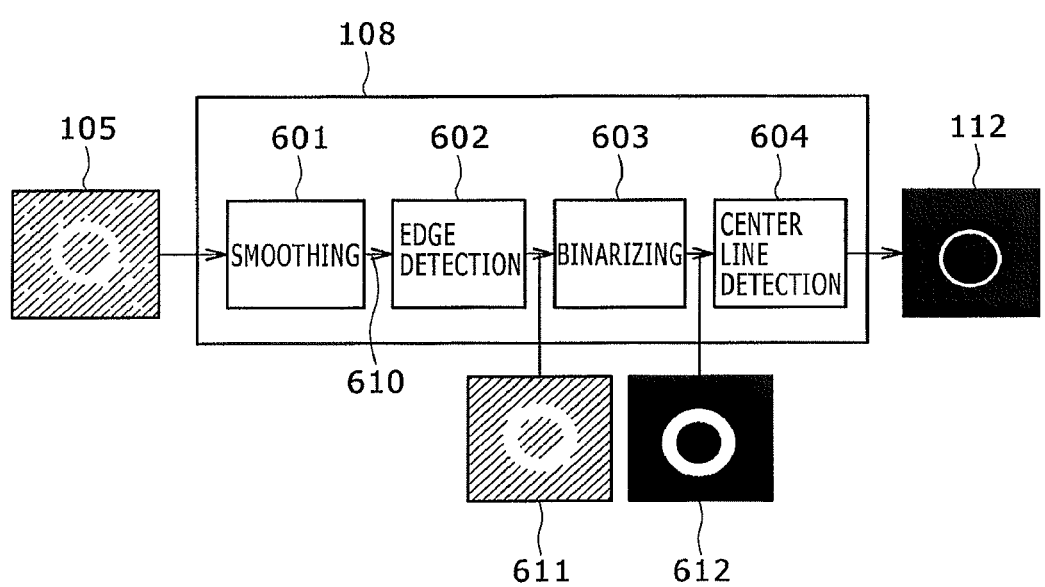
FIG. 3 is a diagram showing the related art for extracting a contour from the SEM image.
Figure 4A:
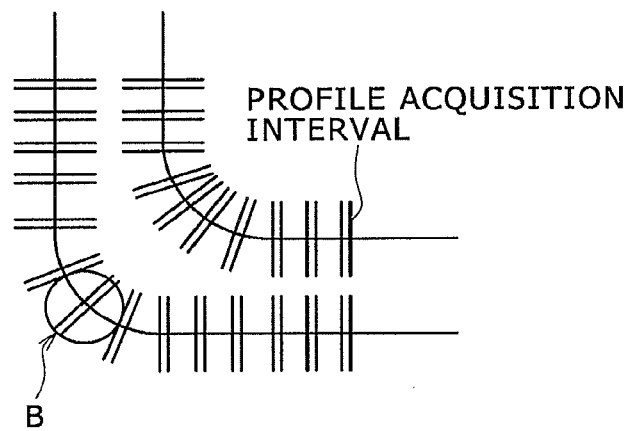
FIG. 4A is a diagram showing a profile acquisition interval.
Figure 4B:
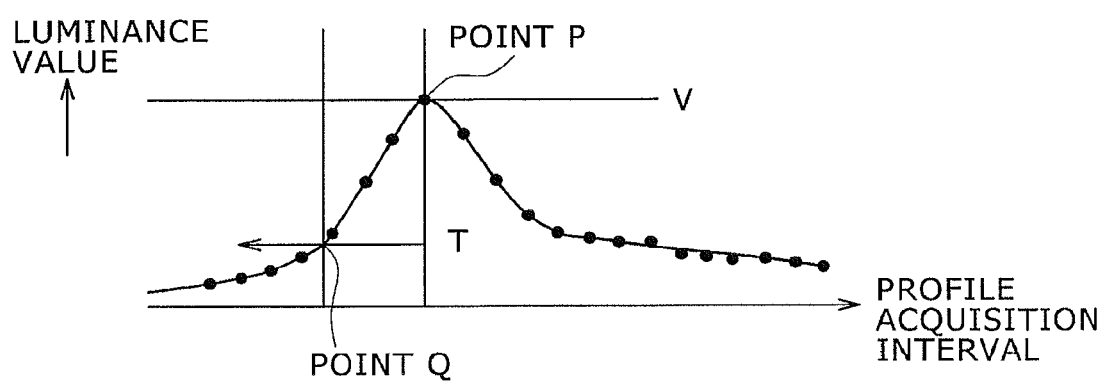
FIG. 4B is a diagram for explaining the related art showing the condition of obtaining an edge position from an intersection between the profile and a threshold value.
Figure 5A:
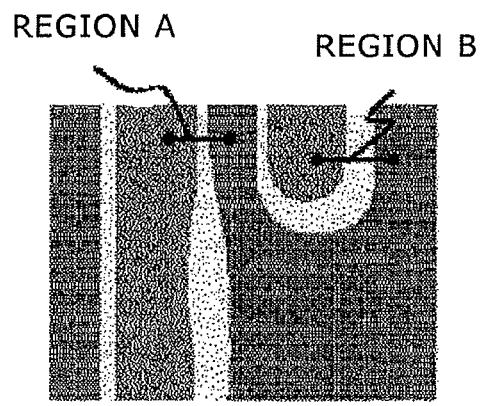
FIG. 5A shows a part of the SEM image shown in FIG. 2A.
Figure 5B:
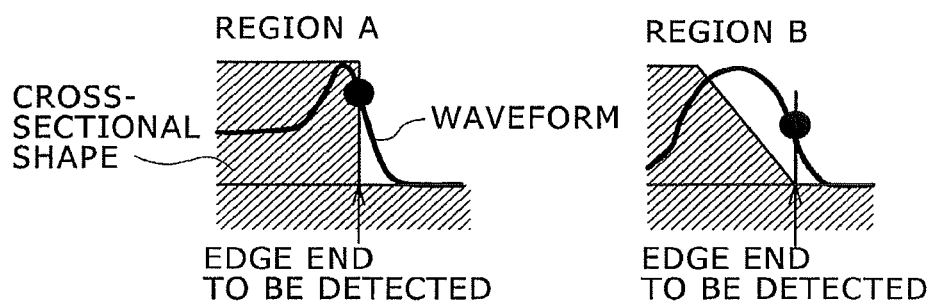
FIG. 5B is a schematic diagram of cross-sectional shapes and secondary electron signal waveforms of the patterns corresponding respectively to regions A and B shown in FIG. 5A.
Figure 5C:
FIG. 5C is a diagram showing the edge position detected by the pattern edge detection method described in JP-A-2007-121147.
Figure 5D:
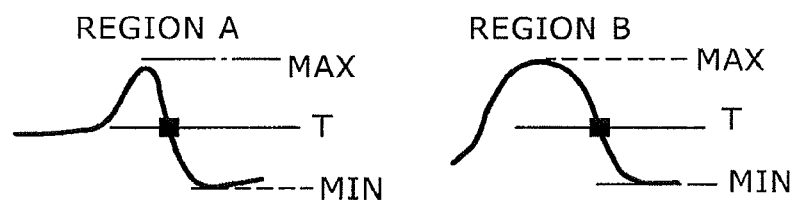
FIG. 5D is a diagram showing the edge position detected by the pattern edge detection method described in JP-A-2001-338304.

(S200): In the present step, the local projection waveform forming section 10102 projects an image in a local area along the contour obtained in the step S100 in the tangential direction of the contour, and generates the local projection waveform. A supplementary explanation for the present step will be presented with reference to FIGS. 6A and 6B. It should be noted that FIG. 6A is an enlarged view of the vicinity of the region B shown in FIG. 5A. The dot line 112 represents the provisional contour extracted in the step S100 (in the case in which the method shown in FIG. 3 is used as described above, the provisional contour becomes a rough center line of the white band). The image along the provisional contour 112 and corresponding to a length p1 in the tangential direction of the provisional contour 112 is projected. In other words, by projecting images in the directions of the arrows for the respective local rectangular areas 202, 203, 304, . . . , the local projection waveforms 210 as shown in FIG. 6B are obtained. The projection length p1 and the pitch p2 in which the projection waveforms are obtained can be fixed values, or can be variable in accordance with the pattern shape so that, in accordance with the curvature of the contour, the p1 and p2 become small in a region with large curvature, and the p1 and p2 become large in a region with small curvature, for example.

(S300): In the present step, the library matching section 10103 executes matching of the local projection waveforms obtained in the step S200 with an SEM waveform library 30 previously created and stored in the storage section 1011. The SEM waveform library 30 is obtained by correlating the cross-sectional shape of the sample and the SEM waveform with each other, and can be created by, for example, the method described in "Scanning electron microscope analog of scatterometry," by J. S. Villarrubia, A. E. Vladar, J. R. Lowney, and M. T. Postek, Proc. SPIE 4689, pp. 304-312 (2002), namely by calculating the SEM waveforms in various cross-sectional shapes using the electron beam simulation (Monte Carlo simulation).

Figure 7:
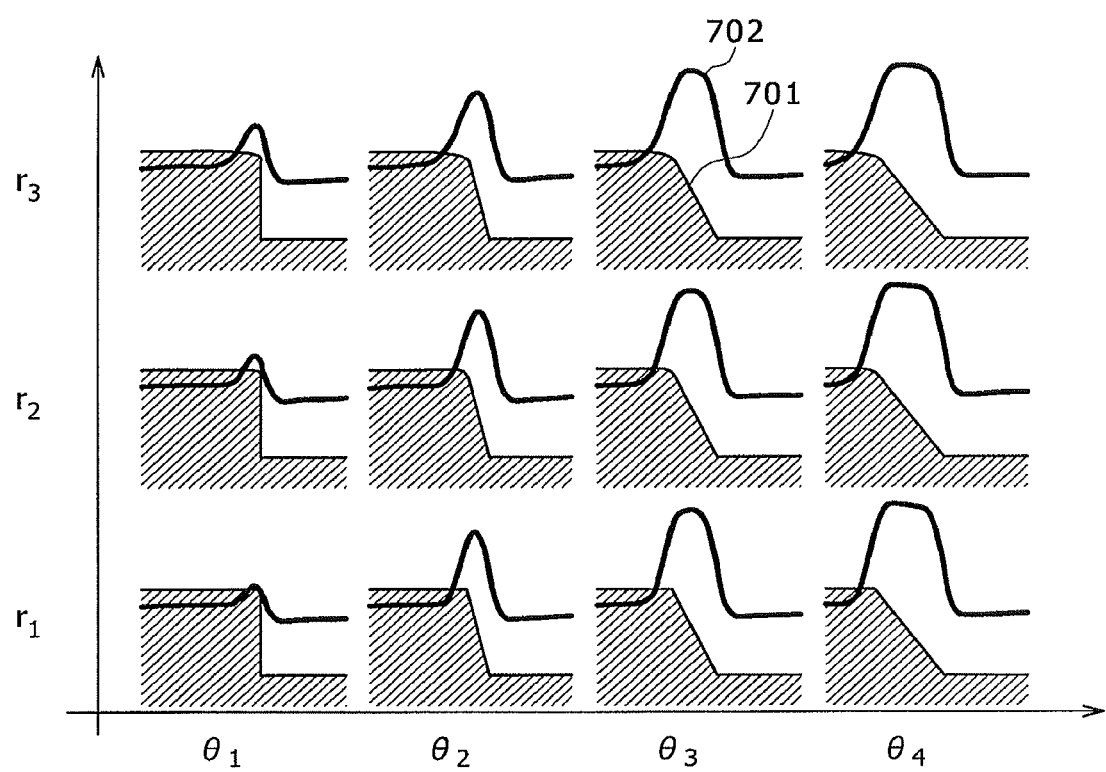
FIG. 7 is a conceptual diagram of an SEM waveform library.

FIG. 7 is a conceptual diagram of the SEM waveform library. The horizontal axis represents a degree of the sloping angle of the sample, and the vertical axis represents a degree of rounding of the top corner thereof. The SEM waveforms 702 in the respective cross-sectional shapes 701 are calculated using the Monte Carlo simulation, and are stored to form pairs with the corresponding cross-sectional shapes. By selecting one matching best with the local projection waveform obtained in the step S200 out of the SEM waveforms stored in the library using the waveform matching process, the cross-sectional shape of the pattern in the region where the local projection waveform is obtained can be estimated. It should be noted that although in FIG. 7, the cross-sectional shape of the pattern is represented with the two parameter, namely the sloping angle and the rounding of the top corner for the sake of simplicity, it is necessary to provide other parameters necessary for representing the cross-sectional shape than the parameters described above, in reality. For example, the height of the pattern and rounding of the bottom corner can be cited. Further, when determining the types of the parameters and the variation range of the parameters for representing the cross-sectional shape of the pattern, it is possible to use the result of the exposure simulation described in the "Related Art" section.

(S400): In the present step, the edge position determination section 10104 determines the edge positions on the local projection waveforms based on the cross-sectional shapes of the pattern estimated is the step S300, respectively. Since the correlation between the cross-sectional shape of the pattern and the SEM waveform is know on the SEM waveform library 30, by defining a desired edge end (e.g., the bottom end) of the pattern with respect to the cross-sectional shape of the pattern, the position of the edge end is propagated to the SEM waveform forming the pair, and further, the corresponding position on the local projection waveform is propagated.

Figure 8A:
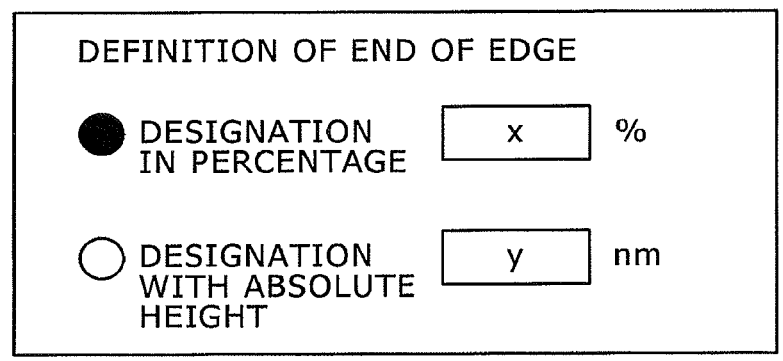
FIG. 8A is a diagram showing an area for inputting conditions for defining the edge end in a GUI screen provided for the user to define the edge end.
Figure 8B:
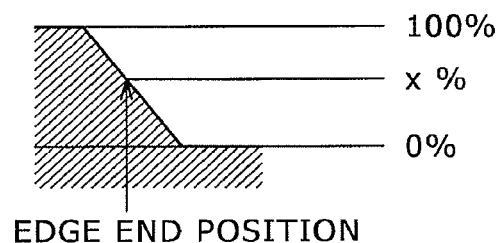
FIG. 8B is a diagram showing the state in which the edge end defined in percentage is detected.
Figure 8C:
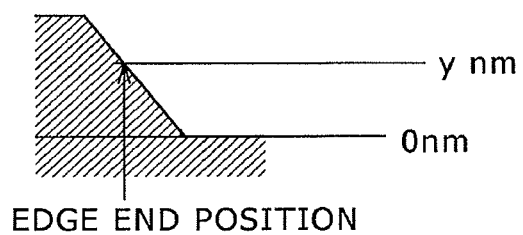
FIG. 8C is a diagram showing the state in which the edge end defined with the height is detected.

FIGS. 8A through 8C shows an example of GUI screen for the user to designate the edge end of the cross-sectional surface of the pattern. Whether the edge end in a predetermined percentage is detected (the bottom end is designated by setting 0%) as shown in FIG. 8B or the edge end in a predetermined height is detected (the bottom end is designated by designating 0 nm) as shown in FIG. 8C is designated in accordance with the usage.

(S500): In the present step, the coordinate conversion/contour extraction section 10105 converts the edge positions on the local projection waveforms determined in the step S400 into the positions on the SEM image.

(S600): Further, the coordinate conversion/contour extraction section 10105 obtains a conclusive contour as a range of coordinates on the SEM image obtained in the step S500.

(S700): The dimension measurement section 10106 measures a dimension of a desired position of the pattern or a distance between patterns adjacent to each other using the contour obtained in the step S600.

The result measured in the step S700 is displayed on the screen of the output section 1012, and at the same time, stored in the server 1013 via the communication line.

Figure 9:
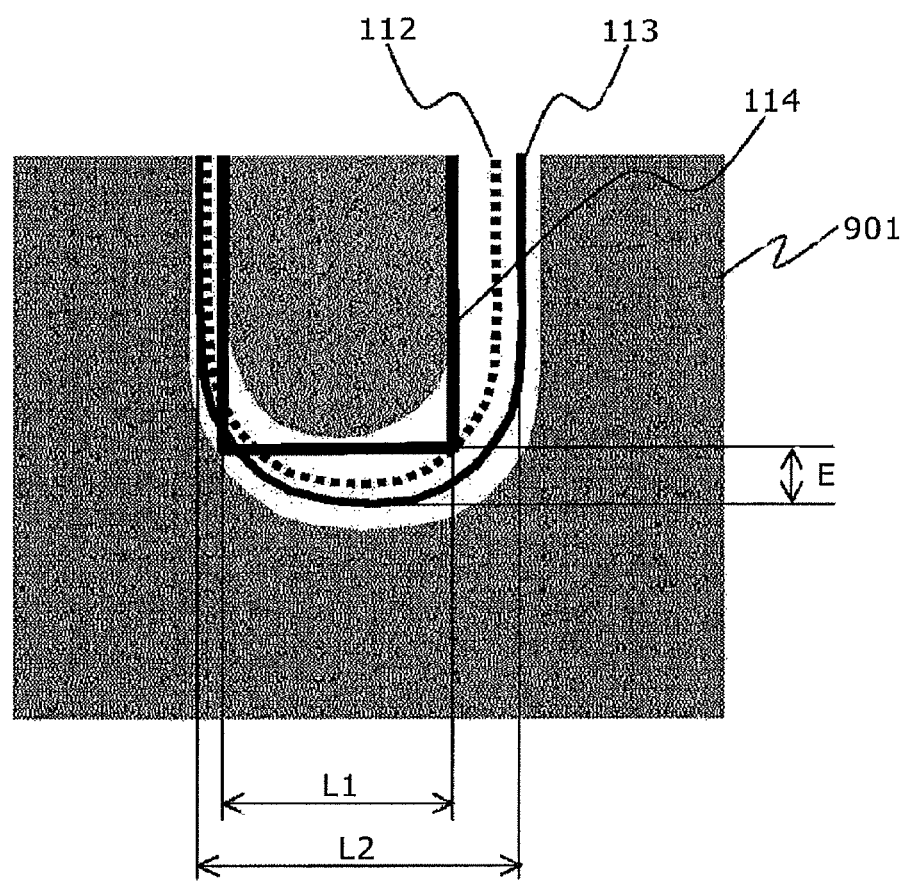
FIG. 9 is an explanatory diagram of comparative evaluation between the conclusive output result and the design data.

As an example of the display on the screen of the output section 1012, the case of displaying the conclusive contour, which is obtained in the step S600, and corresponds to the same region as shown in FIG. 6A, is shown in FIG. 9. In FIG. 9, the dot line 112 displayed on the SEM image 901 in an overlapping manner is the provisional contour obtained in the step S100, and the sold line 113 is the conclusive contour.

The contour 113 thus obtained can be used, for example, for comparison with the design data 114 illustrated with a bold line. By thus comparing with the design data, it becomes possible to perform the evaluation such as an edge placement error amount E or the difference between the line width L1 in design and the real line width L2 with higher reliability compared to the case of using the contour 112 obtained by the related art, thus the OPC verification with higher accuracy becomes possible.

Further, the present invention can also be applied to the usage of monitoring the process variation besides the OPC verification. Further, besides the shape measurement of the pattern transferred on the silicon wafer, it is also possible to apply a substantially the same method to the shape measurement of the photo mask.

Second Embodiment

Figure 10B:
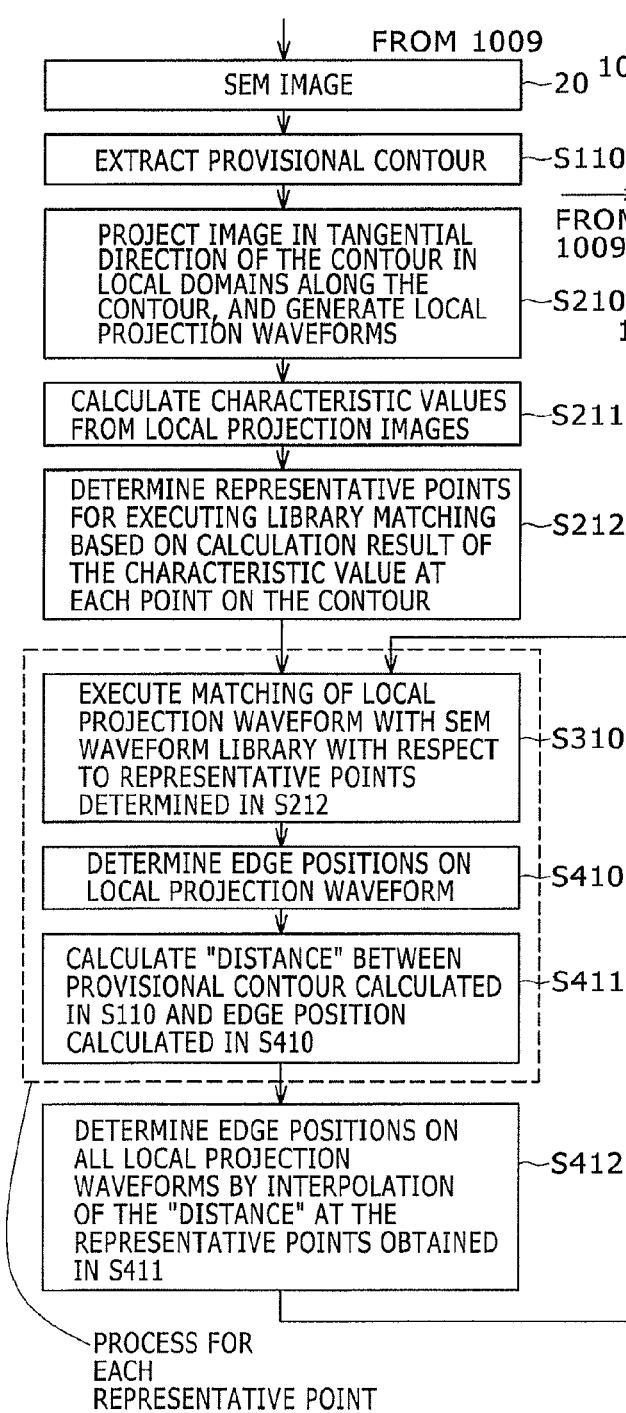
FIG. 10B is a flowchart showing a processing procedure in the operation section according to the second embodiment.

FIG. 10B is a flowchart of the shape measurement according to a second embodiment of the present invention. Although the configuration of the SEM system in the present embodiment is basically the same as the configuration shown in FIG. 1A explained in the first embodiment, the configuration of the operation section 1010 is slightly different.

Figure 10A:
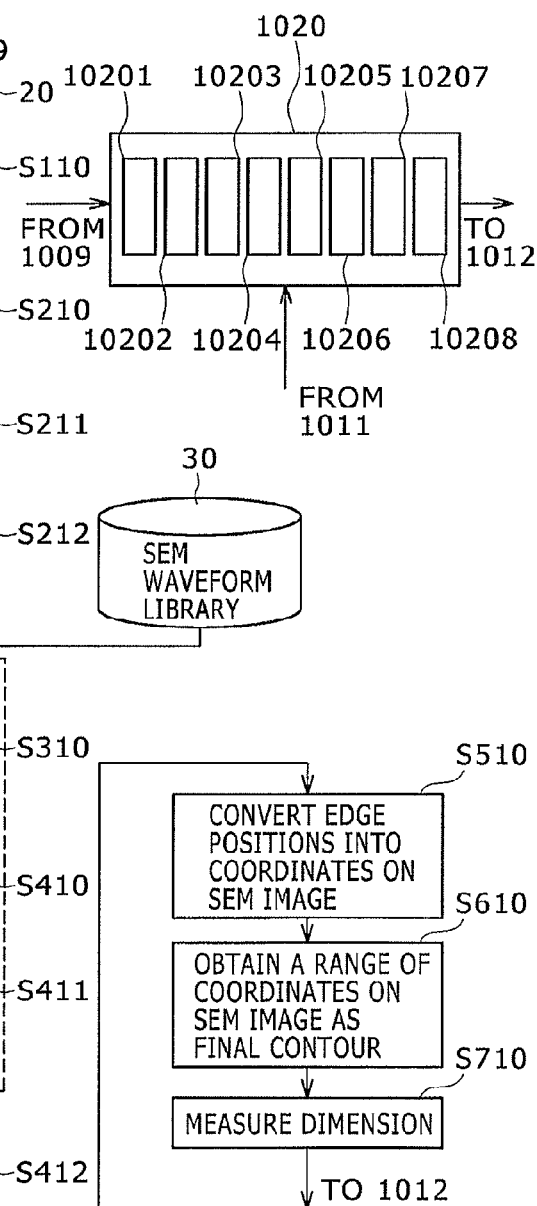
FIG. 10A is a block diagram showing a configuration of an operation section according to a second embodiment, and for processing the SEM image to obtain the dimension of a pattern.

FIG. 10A shows the configuration of the operation section 1020 in the present embodiment. The operation section 1020 is provided with a provisional contour extraction section 10201, a local projection waveform forming section 10202, a characteristic value calculation section 10203, a representative point extraction section 10204, a library matching section 10205, an edge determination section 10206, a coordinate conversion/contour extraction section 10207, and a dimension measurement section 10208.

Hereinafter, each of the steps will be explained along the flowchart shown in FIG. 10B.

(S110): Similarly to the step S100 in the first embodiment, the provisional contour extraction section 10201 extracts the provisional contour from the SEM image 20, which is obtained by the SEM 10 imaging the inspection-object sample, and is output from the overall control/image processing section 1009.

(S210): Similarly to the step S200 in the first embodiment, the local projection waveform forming section 10202 projects an image in a local area along the contour obtained in the step S110 in the tangential direction of the contour, and generates the local projection waveform.

Figure 11A:
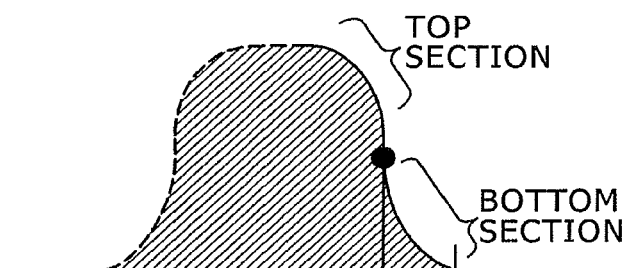
FIG. 11A is a diagram showing a cross-sectional shape a pattern.
Figure 11B:
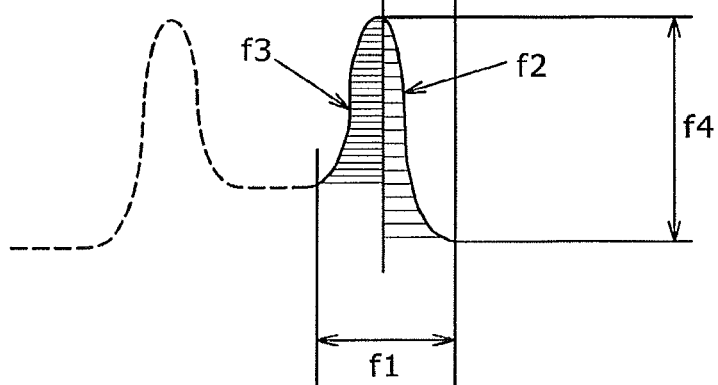
FIG. 11B is diagram showing a signal waveform in the SEM image of the pattern shown in FIG. 11A.

(S211): In the present step, the characteristic value calculation section 10203 calculates various characteristic values with respect to the pattern cross-sectional shape 1100 shown in FIG. 11A from the local projection waveform generated in the step S210. In FIG. 11B, the characteristic value f1 represents a white band width. The white band width is a characteristic value reflecting an assumed width of the edge section when viewed from vertically above. The characteristic value f2 is an average width of the outside sections from the peak position in the white band section, and is a characteristic value reflecting a degree of the curvature of the bottom section. The characteristic value f3 is an average width of the inside sections from the peak position in the white band section, and is a characteristic value reflecting a degree of the curvature of the top section. The characteristic value f4 is a level of the signal intensity, and is a characteristic value reflecting the degree of the sloping angle as shown in FIG. 7.

Figure 12A:
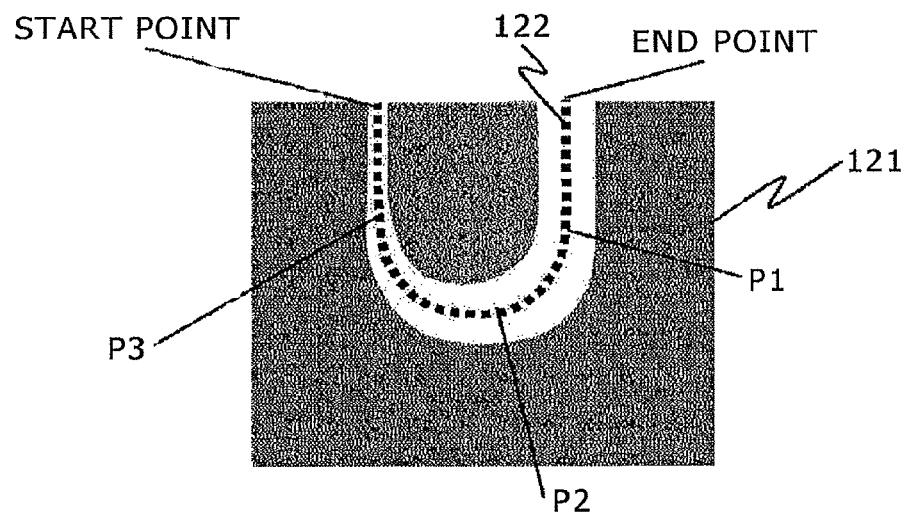
FIG. 12A shows an SEM image.
Figure 12B:
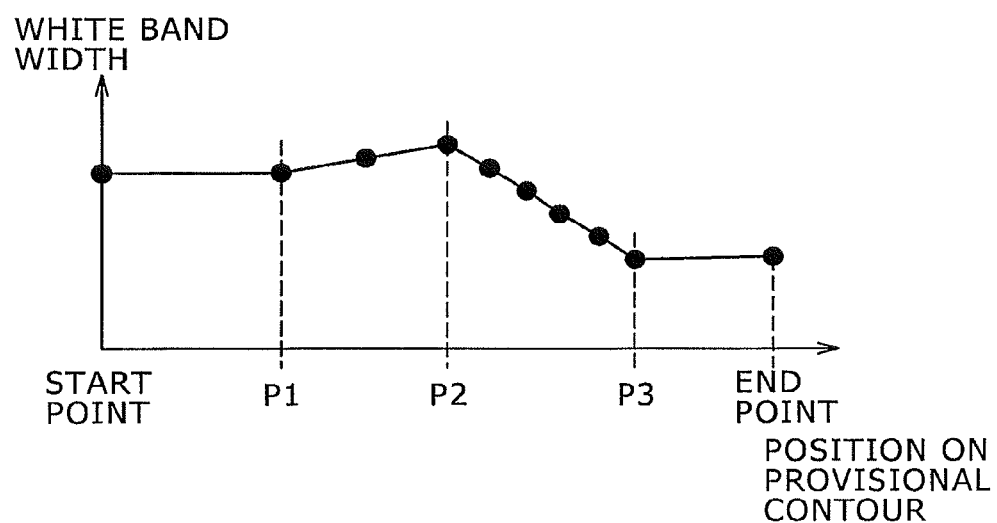
FIG. 12B is a diagram showing a white band width on a provisional contour of the SEM image.

(S212): In the present step, the representative point extraction section 10204 determines representative points, in which the library matching is executed, based on the calculation result of the characteristic values at each point on the provisional contour in the step S211. FIG. 12B shows how the characteristic value f1, namely the white band width varies along the provisional contour 122 on the SEM image 121 shown in FIG. 12A. In the transition of the white band width, the white band width is kept roughly constant from the start point to the point P1 in FIG. 12A, then gently increased before the point P2, then rapidly decreased before the point P3, and then kept roughly constant from the point P3 to the end point. It can be said that the transition of the characteristic value represents the transition of the cross-sectional shape. Since the fact that various characteristic values are kept constant means that the cross-sectional shape is roughly constant, there is no need for estimating the cross-sectional shape at all of the points in the subsequent step.

Therefore, in the present step, the representative points at which the estimation of the cross-sectional shape should be executed are determined based on the transition of the characteristic values. In FIG. 12B, the points provided with black circles are the representative points. As shown in the drawing, the intervals of the representative points are set to be wide in the area with a low rate of change of the characteristic value, or to be narrow in the area with a high rate of change of the characteristic value. In the case of using a plurality of characteristic values as shown in FIG. 11B, the intervals of the representative points are determined for each of the characteristic values, and an average interval or the minimum interval of the representative points can be adopted.

(S310): In the present step, the library matching section 10205 executes matching with the SEM waveform library 30, which is previously created and stored in the storage section 1011, with respect to the representative points determined in the step S210, thereby estimating the cross-sectional shape. The method of matching is substantially the same as the method explained in the step S300 of the first embodiment.

(S410): In the present step, the edge position determination section 10206 determines the edge positions on the local projection waveforms based on the cross-sectional shapes estimated is the step S310, respectively. The method thereof is substantially the same as the method explained in the step S400 of the first embodiment.

Figure 13A:
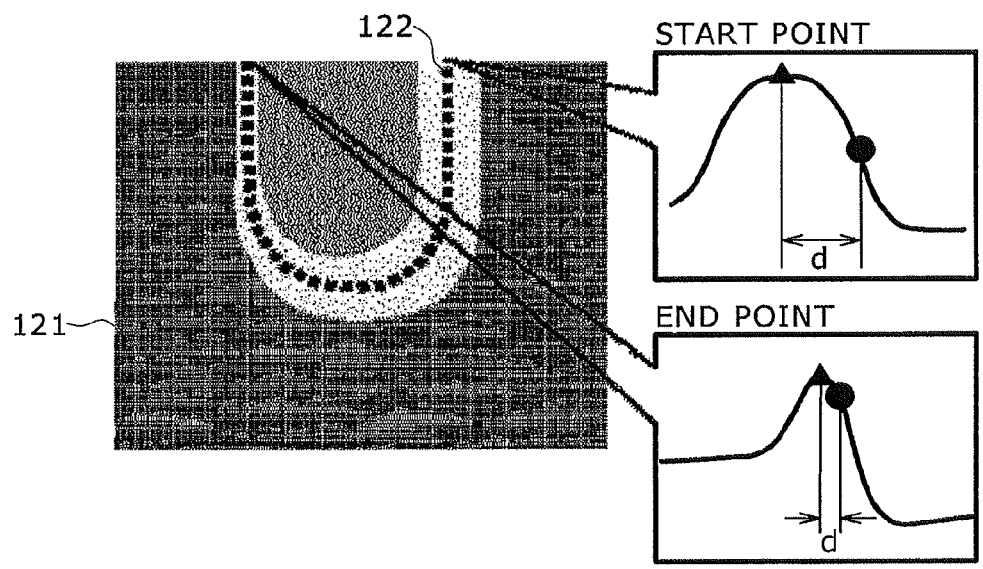
FIG. 13A is a diagram showing the SEM image and the image signal waveforms at a start point and an end point on the SEM image.

(S411): In the present step, the edge position determination section 10206 calculates a distance d between the position (the point with the black triangle shown in FIG. 13A) of the provisional contour calculated in the step S110 on the local projection waveform and the edge position (the point with the black circle shown in FIG. 13A) calculated in the step S410 at each of the representative points. The result of plotting the calculation result of the distance d is shown as the white circles in FIG. 13B.

Figure 13B:
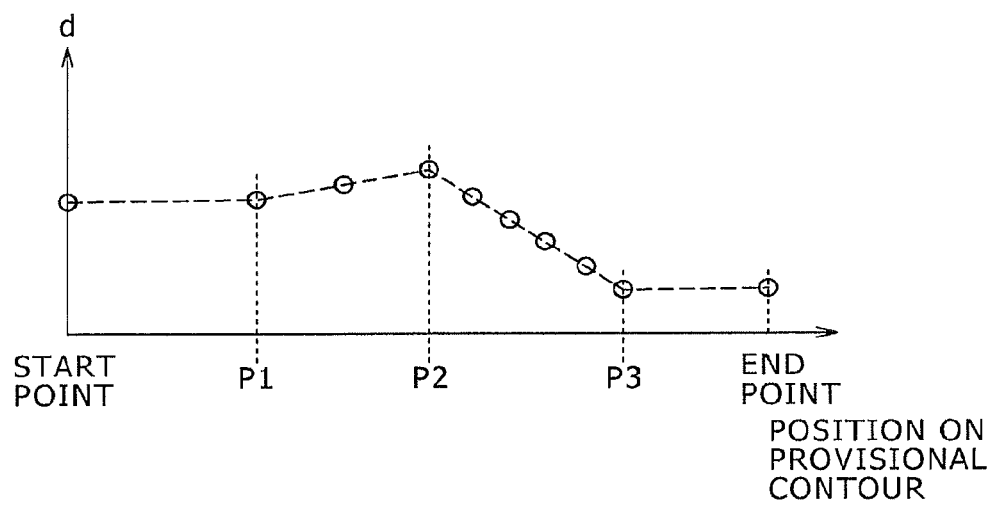
FIG. 13B is a diagram showing a distance d between each of the positions of the provisional contour on the local projection waveform and the edge position obtained in the step S410.

(S412): In the present step, the edge position determination section 10206 interpolates between the values of the distance d (between the white circles in FIG. 13B) calculated in the representative points to obtain the d values in all of the points (the broken line in FIG. 13B shows the result), and corrects the position of the provisional contour based on the d values, thereby determining the edge positions on all of the projection waveforms.

(S510): Similarly to the first embodiment, the coordinate conversion/contour extraction section 10207 converts the edge positions in the local projection waveforms determined in the step S412 into the positions on the SEM image.

(S610): Similarly to the first embodiment, the coordinate conversion/contour extraction section 10208 obtains a conclusive contour as a range of coordinates on the SEM image obtained in the step S510.

(S710): The dimension measurement section 10208 measures a dimension of a desired position of the pattern or a distance between patterns adjacent to each other using the contour obtained in the step S610.

The result measured in the step S710 is displayed on the screen of the output section 1012, and at the same time, stored in the server 1013 via the communication line.

The display on the screen of the output section 1012 is the same as explained in the first embodiment with reference to FIG. 9.

According to the second embodiment, since the library matching process, which is time-consuming, is executed only on the representative points, further high-speed processing becomes possible.

Third Embodiment

Figure 14:
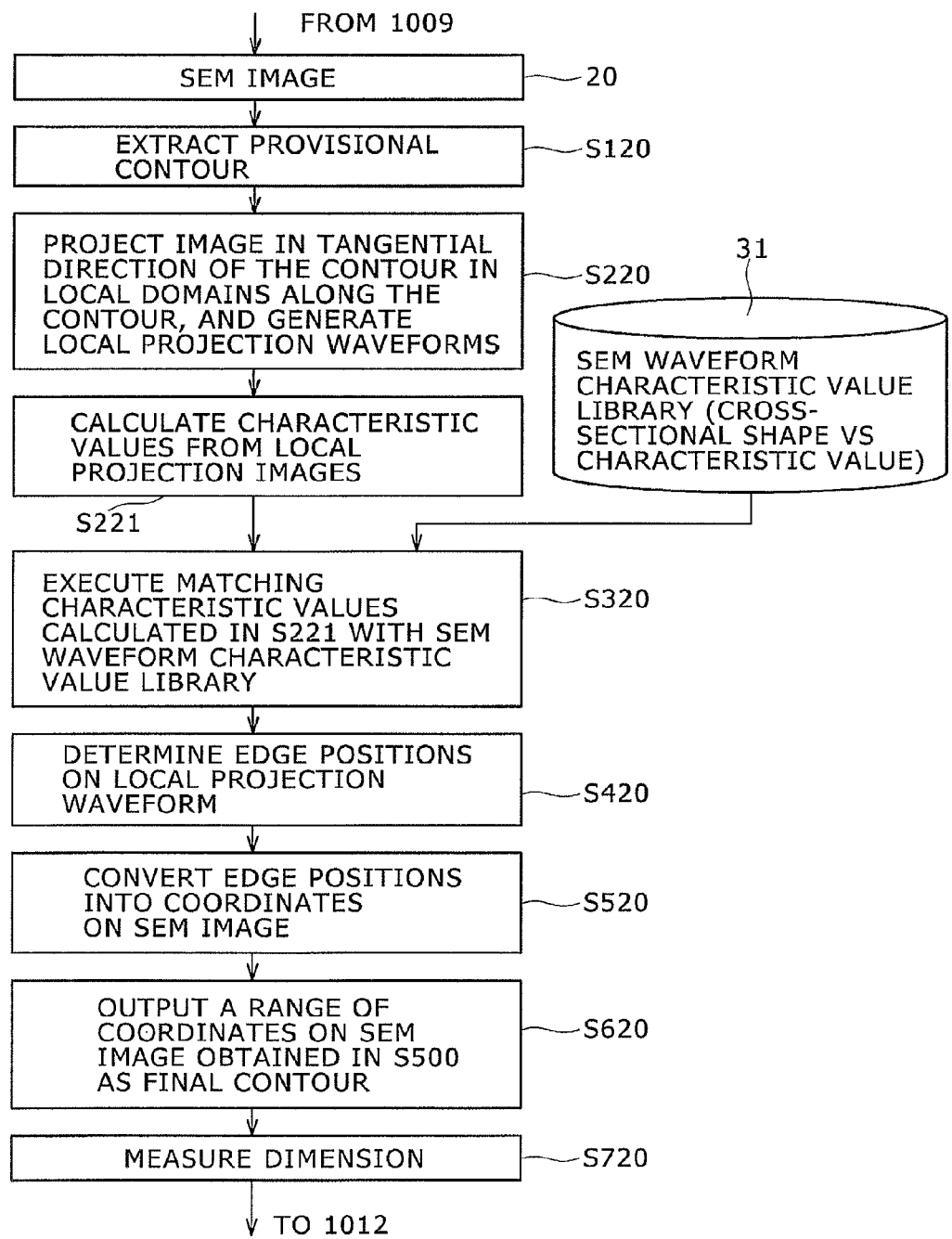
FIG. 14 is a flowchart for explaining a third embodiment.

FIG. 14 is a flowchart of the shape measurement according to a third embodiment of the present invention. Although the flow of the shape measurement according to the present embodiment is basically the same as the case with the first embodiment explained using FIG. 1C, the present embodiment is different from the first and second embodiments in that an SEM waveform characteristic value library 31, which includes the cross-sectional shapes 701' of the pattern and characteristic values obtained from the SEM waveforms 702' correlated with each other, is stored in the storage section 1011, and is used for estimating the cross-sectional shape from the local projection waveform, in contrast that in the first and second embodiments, the library 30 including the cross-sectional shapes 701 of the pattern and the SEM waveforms 702 correlated with each other, and stored in the storage section 1011 is used for estimating the cross-sectional shape from the local projection waveform. In other words, the steps S221 and S320 in the processing flow shown in FIG. 14 are the points different from the processing flow explained with reference to FIG. 1C.

FIG. 15B shows a conceptual diagram of the SEM waveform characteristic value library 31. The SEM waveform characteristic value library 31 is created by creating the SEM waveform library 30 shown in FIG. 15A using the electron beam simulation shown in FIG. 7, and then calculating the waveform characteristic values f1 through f4 shown in FIGS. 11A and 11B from the SEM waveform 702' thus obtained. As shown in FIG. 15A, the SEM waveform characteristic value library 31 is a table describing the change in the characteristic value with respect to the cross-sectional shape parameters (e.g., the sloping angle, the rounding of the top corner) for each of the characteristic values.

In FIG. 14, in the step (S320) of executing matching with the SEM waveform characteristic value library 31, the combination of the cross-sectional shape parameters (e.g., the sloping angle, the rounding of the top corner) best matching with the characteristic value group (f1 through fn) calculated from the local projection waveforms is obtained using, for example, a maximum-likelihood method.

It should be noted that it is also possible to combine the present embodiment with the second embodiment.

Fourth Embodiment

Figure 16:
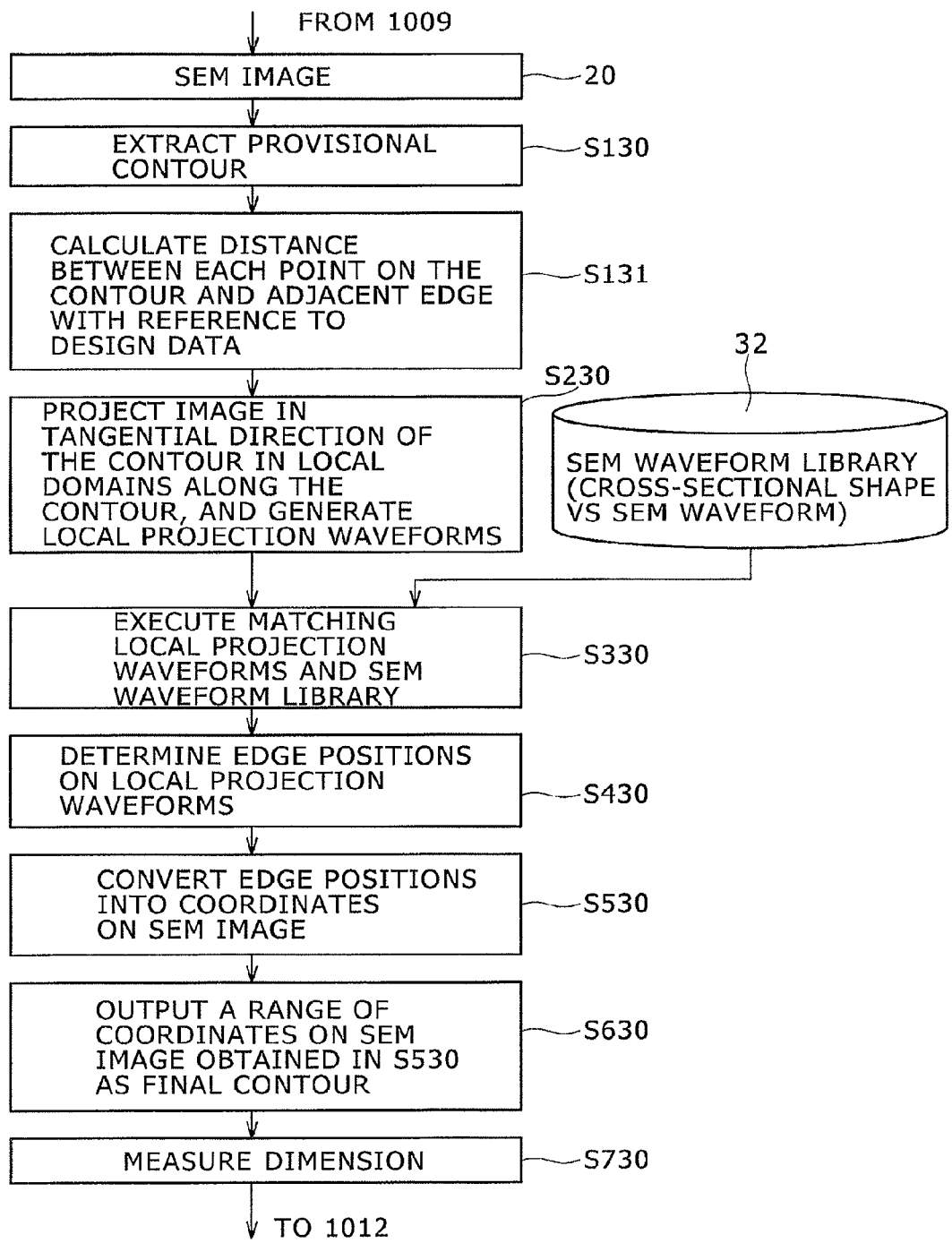
FIG. 16 is a flowchart for explaining a fourth embodiment.

FIG. 16 is a flowchart of the shape measurement according to a fourth embodiment of the present invention. Although the flow of the shape measurement according to the present embodiment is basically the same as the case with the first embodiment explained with reference to FIG. 1C, it is different therefrom in that in the present embodiment, after extracting the provisional contour (S130), matching with the design data is executed, and a distance from an adjacent edge is previously calculated (S131) with respect to each point on the contour by referring to the design data.

Figure 17A:
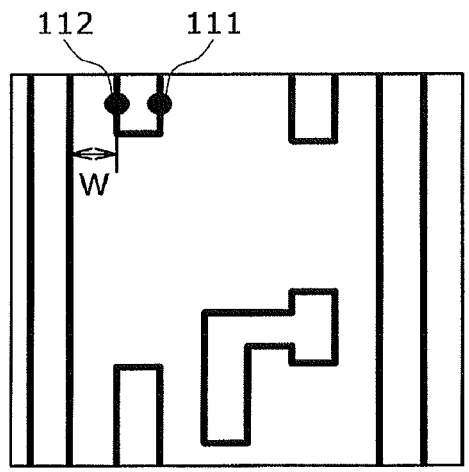
FIG. 17A is a diagram showing an arrangement of circuit patterns created from the design data.

FIG. 17A shows a conceptual diagram of the design data. In the drawing, since the marked point 111, for example, does not have another edge in the vicinity thereof, the information of "distance long" is provided thereto, and since the marked point 112 has an adjacent edge at a position with a distance w, the information of "distance w" is provided thereto.

Figure 17B:
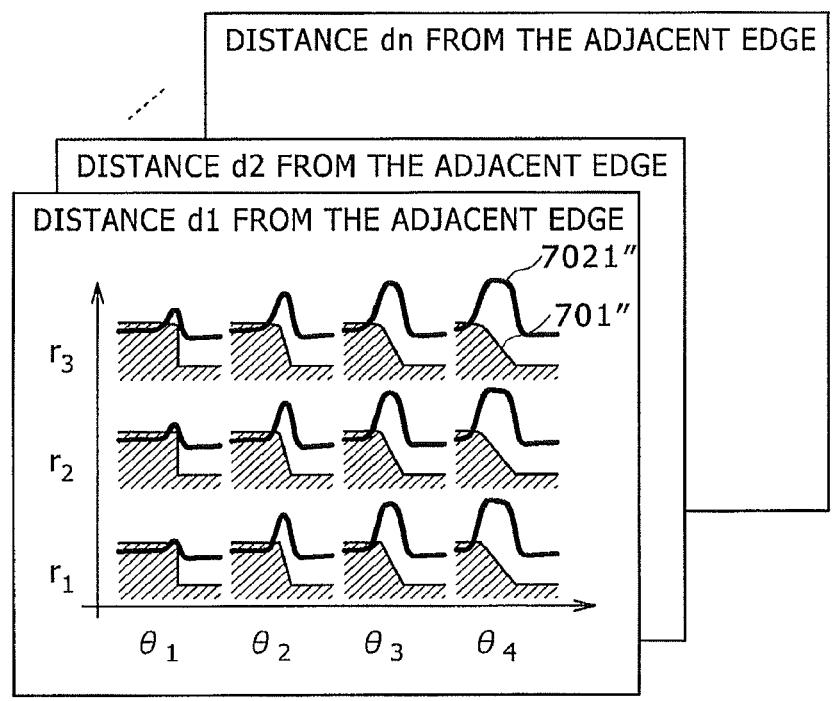
FIG. 17B is a diagram showing an example of the SEM waveform library used in the fourth embodiment.

The step (S230) of generating the local waveforms is substantially the same as the step S200 of the first embodiment. FIG. 17B shows a conceptual diagram of the SEM waveform library 32 used in the present embodiment. When creating the library, the electron beam simulation is executed while varying the distance from the adjacent edge to obtain the relationship between the cross-sectional shape 701" of the pattern and the SEM waveform 702", and then the entire results are stored as the library. When executing matching of the local projection waveform with the SEM waveform library 32 (S330), the information of the distance from the adjacent edge provided thereto in the step S131 is used, and the library corresponding to the distance is used.

It should be noted that since the distance from the adjacent edge do not necessarily follow the design data, when executing the matching (S330), it is possible to use not only the library corresponding to the distance information provided in the step S131, but also the libraries corresponding to the distance range of $\pm\alpha$[nm] around the distance information thus provided.

The reason for using the SEM waveform library 32 corresponding to the distance from the adjacent edge is that the secondary electron signal wave form varies depending on the distance from the adjacent edge. For example, if the edge distance is short, an influence that the intensity of the secondary electron signal from a region located between the edges is reduced is exerted thereon. In the case in which the pattern width or the pattern intervals become less than several tens nanometers due to the miniaturization of the circuit pattern, it is necessary to apply the present embodiment.

Fifth Embodiment

Figure 18:
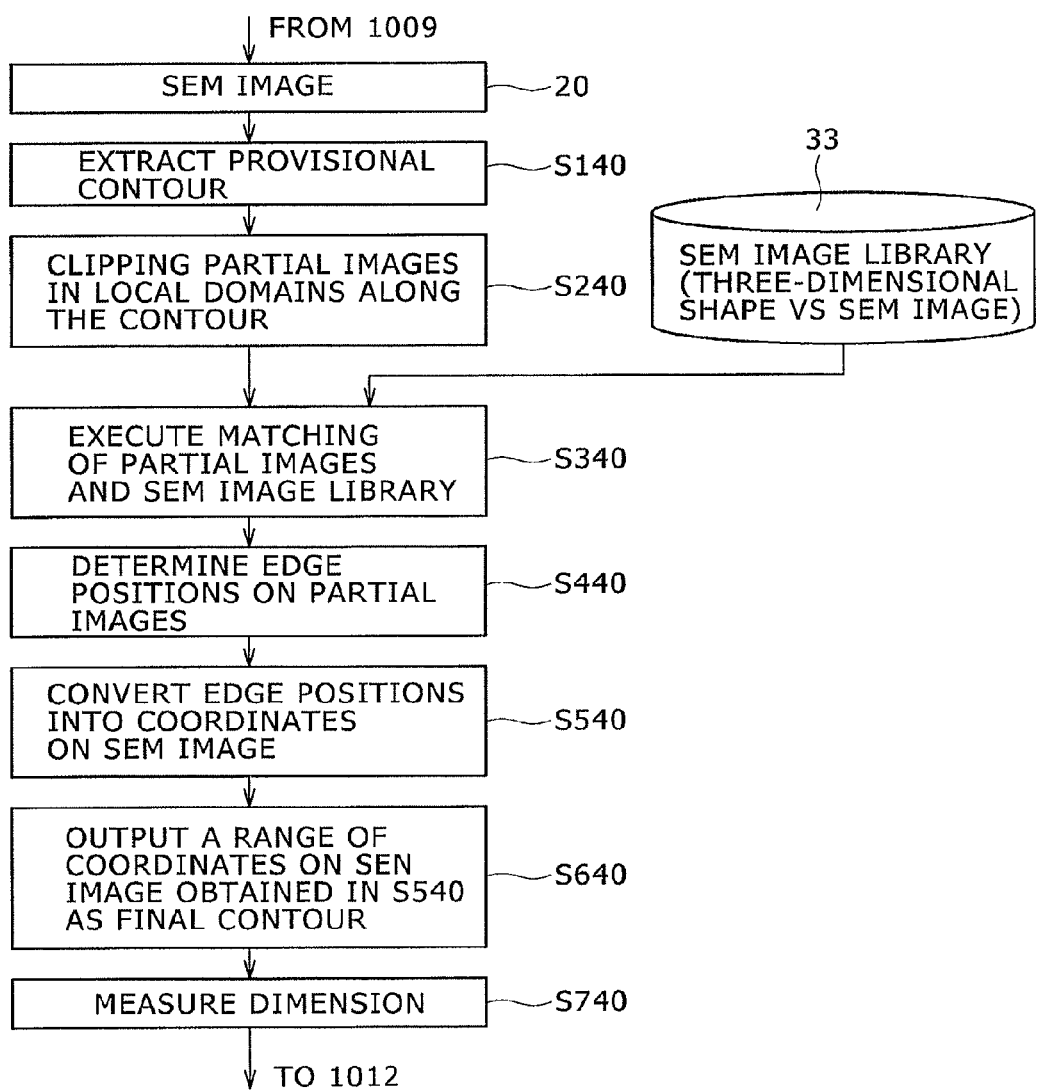
FIG. 18 is a flowchart for explaining a fifth embodiment.

FIG. 18 is a flowchart of the shape measurement according to a fifth embodiment of the present invention. Although the shape measurement flow according to the present embodiment is basically the same as the case with the first embodiment explained with reference to FIG. 1C, it is different therefrom in that in the present embodiment, after extracting the provisional contour (S140), a partial image is clipped in the local area along the contour (S240), and the matching with the SEM image library 33 created by executing the electron beam simulation directed to the three-dimensional cross-sectional shape is executed (S340). The steps on and after S440 are basically the same as the steps on and after S400 explained with reference to FIG. 1C.

The present embodiment is effective in the regions without a straight pattern edge, such as a hole pattern or a line end. Similarly to the fourth embodiment, it is also possible to switch between the case in which the local projection waveform is used for each region with reference to the design data and the case in which the partial image is used.

Sixth Embodiment

Figure 19A:
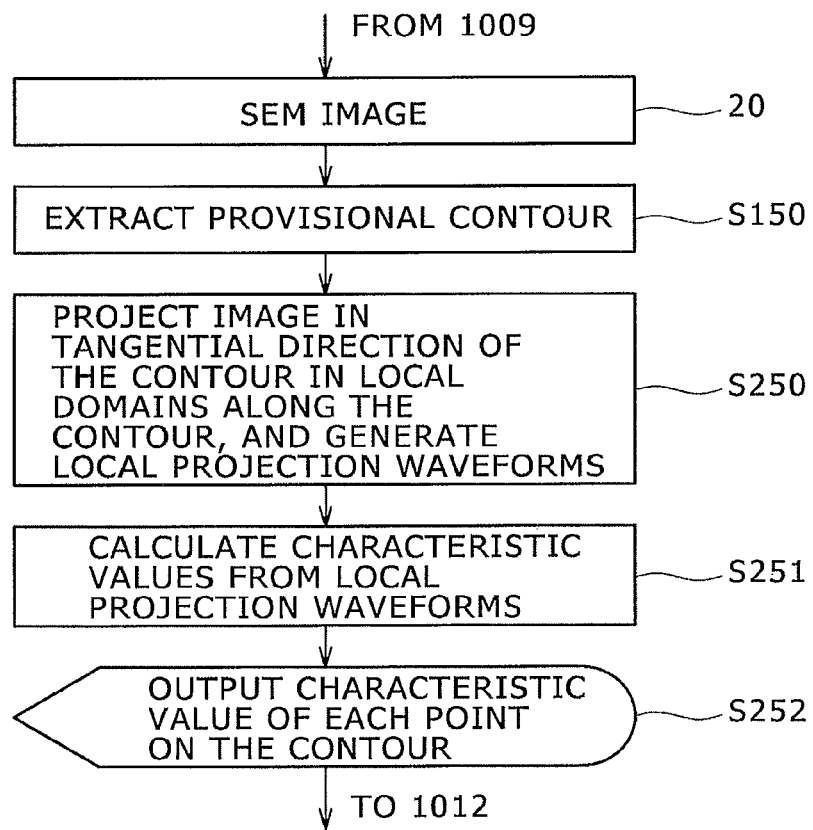
FIG. 19A is a flowchart for explaining a sixth embodiment.

FIG. 19A is a flowchart of the shape measurement according to a sixth embodiment of the present invention. The steps S150, S250, and S251 are substantially the same as the steps S110, S210, and S211 of the second embodiment. Although in the second embodiment, the waveform characteristic values calculated in the step S210 are used for selecting the representative points, in the present embodiment, the calculation result of the waveform characteristic values calculated in the step S251 is presented to the user (S252), and then the process is terminated.

Figure 19B:
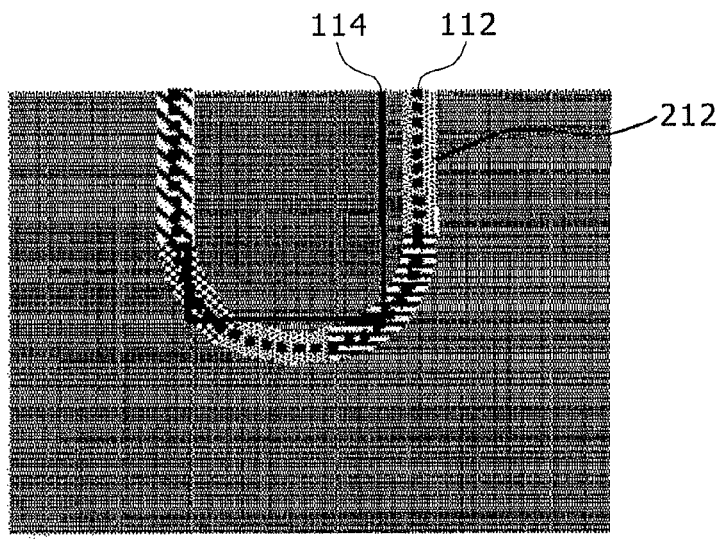
FIG. 19B is a diagram showing an example of a display screen of the waveform characteristic value in the sixth embodiment.

FIG. 19B shows an example of the display screen of the waveform characteristic values (the region is the same as shown in FIG. 9). The drawing shows the characteristic value f1 (the white band width), which is calculated from the local projection waveforms generated along the provisional contour 112 extracted in the step S150, using a different color for each range of the value.

As described above, the waveform characteristic value reflects the cross-sectional shape, and is therefore effective for the purpose of capturing how the cross-sectional shape varies according to the region. Further, the data forming the basis of the color separation display is the data shown in FIG. 12B, and it is also possible to accumulate the data, and then use the data for process monitoring.

Seventh Embodiment

Figure 20:
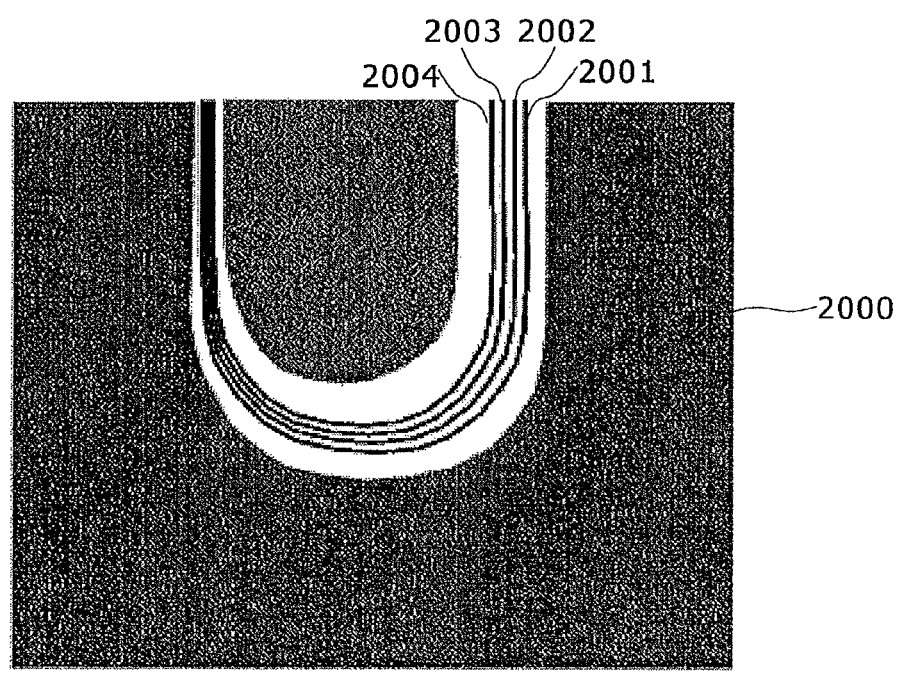
FIG. 20 is a diagram showing an example of outputting a plurality of edge ends in a seventh embodiment.

Although in the first through fifth embodiments, a single contour is output, it is also possible to output a plurality of edge ends, for example, at heights of 0% (2001), 25% (2002), 50% (2003), and 75% (2004) on the SEM image 2000 (see FIG. 20). Alternatively, since the cross-sectional shape has already been estimated at each point, it is possible to output the plurality of edge ends as contour lines.

In the resist patterns, since it is essential to figure out the situation of so-called film thickness loss (reduction of the resist height), in particular, in comparison with the exposure simulation result described in "Related Art" section as an object of comparison of the output result, the present embodiment is effective.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A scanning electron microscope system, comprising:
an acquiring means which, using a scanning electron microscope, acquires an image of a desired area of a sample provided with a pattern formed on a surface thereof;
a calculating means which calculates a local projection waveform at each point, or at each representative point, on an edge of the pattern in the acquired image of the sample;
a storing means which stores a library correlating a cross-sectional shape of the pattern of the sample and electron beam signal waveform information corresponding to the cross-sectional shape of the pattern of the sample;
an estimating means which estimates a local cross-sectional shape of the pattern, using information stored in the library;
a deciding means which decides a plurality of edge positions on the projection waveform, based on the local cross-sectional shape;
a calculating means which calculates contour information, based on the plurality of edge positions; and
a calculating means which calculates a dimensioned pattern, based on the contour information.

2. The scanning electron microscope system of claim 1, further comprising:
a displaying means which displays information on a screen, the information being related to the dimensioned pattern calculated by the calculating means.

3. The scanning electron microscope system of claim 1, wherein the displaying means displays contour information corresponding to the plurality of edge positions.

4. The scanning electron microscope system of claim 1, wherein the plurality of edge positions are end positions of the plurality of edges.

5. The scanning electron microscope system of claim 1, wherein the plurality of edge positions have mutually different heights.

6. The scanning electron microscope system of claim 1, wherein the extracting means extracts information of at least one distance between a plurality of patterns as the dimension information of the pattern, and
wherein the outputting means displays information of the at least one distance between the plurality of extracted patterns, in conjunction with design data of the plurality of patterns on the screen.

7. The scanning electron microscope system of claim 1, wherein the library stored in the storing means includes electron beam signal waveforms of a plurality of cross-sectional shapes of the sample as obtained by a computer simulation.

8. The scanning electron microscope system of claim 1, wherein in the library stored in the storing means, the electron beam signal waveform information corresponding to the cross-sectional shape of the pattern to be correlated with the cross-sectional shape of the pattern of the sample is a characteristic value of an electron beam signal waveform obtained from the local projection waveform generated by projecting the image of the pattern in a tangential direction with respect to the edge of the pattern.

9. A method using a scanning electron microscope, comprising:

using a scanning electron microscope to acquire an image of a desired area of a sample provided with a pattern formed on a surface thereof;

calculating a local projection waveform on an edge of the pattern at each point, or at each representative point, of an edge of the pattern in the acquired image of the sample;

storing a library correlating a cross-sectional shape of the pattern of the sample and electron beam signal waveform information corresponding to the cross-sectional shape of the pattern of the sample;

estimating an local cross-sectional shape of the pattern, using information stored in the library;

deciding a plurality of edge positions on the projection waveform, based on the local cross-sectional shape;

calculating contour information, based on the plurality of edge positions; and calculating a dimensioned pattern, based on the contour information.

10. The method of claim 9 using a scanning electron microscope, further comprising:

displaying information on a screen, the information being related to the calculated dimensioned pattern, and based on the contour information.

11. The method of claim 9 using a scanning electron microscope, wherein the displaying step displays contour information corresponding to the plurality of edge positions.

12. The method of claim 9 using a scanning electron microscope, wherein the plurality of edge positions are end positions of the plurality of edges.

13. The method of claim 9 using a scanning electron microscope, wherein the plurality of edge positions have mutually different heights.

14. The method of claim 9 using a scanning electron microscope, further comprising:

extracting information of at least one distance between a plurality of patterns as the dimension information of the pattern, and outputting information of the at least one distance between the plurality of extracted patterns, in conjunction with design data of the plurality of patterns on the screen.

15. The method of claim 9 using a scanning electron microscope, wherein the library stored in the storing step includes electron beam signal waveforms of a plurality of cross-sectional shapes of the sample as obtained by a computer simulation.

16. The method of claim 9 using a scanning electron microscope, wherein in the library stored in the storing step, the electron beam signal waveform information corresponding to the cross-sectional shape of the pattern to be correlated with the cross-sectional shape of the pattern of the sample is a characteristic value of an electron beam signal waveform obtained from the local projection waveform generated by projecting the image of the pattern in a tangential direction with respect to the edge of the pattern.

* * * * *